US006879863B2

(12) United States Patent
Mueller et al.

(10) Patent No.: US 6,879,863 B2
(45) Date of Patent: Apr. 12, 2005

(54) USER INTERFACE FOR CONTROLLING A WHIRLPOOL TUB

(75) Inventors: Carl F. Mueller, Sheboygan, WI (US); Jeffrey F. Tempas, Oostburg, WI (US); Peter W. Swart, Oostburg, WI (US); Carter J. Thomas, Cedarburg, WI (US); Ronald A. Bauer, Belgium, WI (US)

(73) Assignee: Kohler Co., Kohler, WI (US)

( * ) Notice: Subject to any disclaimer, the term of this patent is extended or adjusted under 35 U.S.C. 154(b) by 209 days.

(21) Appl. No.: 10/410,024

(22) Filed: Apr. 9, 2003

(65) Prior Publication Data

US 2004/0204779 A1 Oct. 14, 2004

(51) Int. Cl.[7] .............................................. G05B 15/00
(52) U.S. Cl. ............................ 700/85; 700/17; 700/19; 700/65; 700/66; 700/75; 700/302; 340/524; 340/686.1; 340/688; 116/300; 116/305; 116/306; 116/309
(58) Field of Search ........................... 700/17, 19, 20, 700/65, 66, 75, 83, 85, 302; 417/44.6; 340/524, 688, 686.1; 200/11 R, 13, 14, 18, 42.01, 564, 565, 570; 116/280, 284, 300, 309, 305–307, 316

(56) References Cited

U.S. PATENT DOCUMENTS

| 4,233,694 A | 11/1980 | Janosko et al. |
| 4,296,411 A | * 10/1981 | Romanelli et al. ..... 340/870.02 |
| 4,678,344 A | * 7/1987 | Inoue ......................... 368/69 |
| 4,844,333 A | 7/1989 | Davis et al. |
| 5,245,221 A | 9/1993 | Schmidt et al. |
| 5,361,215 A | 11/1994 | Tompkins et al. |
| 5,548,854 A | 8/1996 | Bloemer et al. |
| 5,550,753 A | 8/1996 | Tompkins et al. |
| 5,898,958 A | 5/1999 | Hall |
| 6,227,068 B1 | * 5/2001 | Masui et al. ............... 74/473.3 |
| 6,407,469 B1 | 6/2002 | Cline et al. |

FOREIGN PATENT DOCUMENTS

EP          0 204 666          12/1986

* cited by examiner

*Primary Examiner*—Anthony Knight
*Assistant Examiner*—Crystal J. Barnes
(74) *Attorney, Agent, or Firm*—George E. Haas; Quarles & Brady LLP (57) ABSTRACT

An apparatus is provided to control a plumbing fixture, such as a whirlpool, that has electrically operated components. The apparatus has a dial that is moveable by the user into a plurality of positions to select a function of the plumbing fixture to be controlled. A unique sensor arrangement detects motion and the direction of the motion and provides a signal to a controller that changes the valve of a pointer that designates which function is presently selected. The user then presses a keypad to indicate whether the selected function is to be activated or deactivated and to control the intensity of the selected function. The signals from the keypad also are applied to the controller.

39 Claims, 4 Drawing Sheets

USER INTERFACE FOR CONTROLLING A WHIRLPOOL TUB

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

The present invention relates to plumbing equipment, such as spas and whirlpool tubs, and more particularly to electrical control systems for operating components of the spa or whirlpool tub, and specifically to user interface devices for the whirlpool control system.

2. Description of the Related Art

Hydro-massage spas and whirlpool tubs provide a therapeutic massaging action by delivering water through several nozzles in the tub walls to create a circulating flow of turbulent water. The tub water is drawn through a drain to a pump and then is forced outward through the nozzles to create jets of water in the tub. Air can be added to the circulating water at a controlled rate at each nozzle to increase the turbulence and massaging action of the water exiting the nozzle. Often each nozzle can be pivoted to direct its jet of water toward a desired area of the bather's body. Some nozzles even allow adjustment of the amount of water flow or the amount of air that is mixed with the water.

Valves are operated to regulate the amount of water flow and pulsate that flow to provide a massaging effect replicating the rhythmic manipulation of tissue performed by a masseur or masseuse. The water flow can be fed sequentially through a series of jets to provide a progressive stimulation along the bather's spine which is particularly soothing to the back and neck of an individual.

To enhance the bathing experience underwater lamps can be controlled to produce light of varying color.

Because of the relatively large number of functions that are provided on a top of the line whirlpool, its operation is governed by a microcomputer based control system. While such computerized control simplifies the hardware necessary to control all the pumps, valves, heater, lights, and other whirlpool components, the bather still has to select which of the numerous functions for those components are to be active and configure the intensity of the active functions. Heretofore, this required a complex user control panel. Thus, there is a need to provide a simple, easy to use input device by which the bather is able to individually control the numerous functions on a state of the art whirlpool.

SUMMARY OF THE INVENTION

A user interface produces signals for controlling plumbing equipment, such as a whirlpool for example, that has electrically operated components. The user interface includes a dial which is moveable into a plurality of positions along a path and a plurality of magnets is attached to the dial. A plurality of sensors is positioned along the path, wherein each sensor produces an output signal when one of the magnets is adjacent thereto. The number of dial positions is greater than the number of sensors.

A controller is connected to the plurality of sensors and determines motion of the dial in response to the output signals from the plurality of sensors. In a preferred embodiment of the user interface, the controller determines when the dial has moved a given amount and the direction of that movement. The controller employs that determination in selecting a function of the plumbing equipment to be controlled. The preferred user interface also has other input devices by which the user defines operational characteristics of the selected function. Indicators of selection of a particular function and the magnitude of an operational characteristic of the selected function are provided to the user. Thus the functions can be controlled independently by means of this user interface.

DETAILED DESCRIPTION OF THE INVENTION

Figure 1:
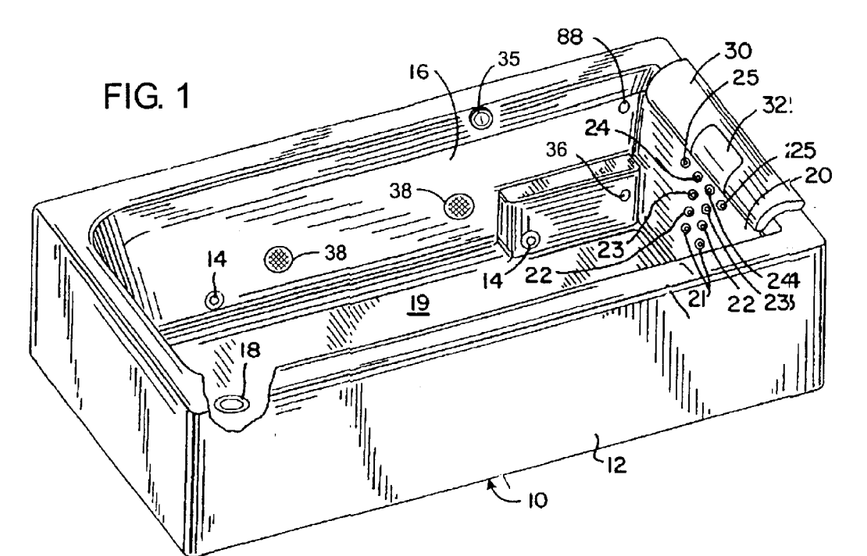
FIG. 1 is an isometric view of a whirlpool that incorporates the present invention.

With reference to FIG. 1, a hydro-massage whirlpool 10 includes a tub 12 having a plurality of conventional whirlpool nozzles 14 projecting through an interior side wall 16. The tub floor 19 has a standard drain opening 18. One end of the tub 12 has an end wall 20 with a plurality of nozzles 21, 22, 23, 24 and 25 that are arranged in pairs. Four of the pairs 21, 22, 23 and 24 are stacked above one another with the fifth pair of nozzles 25 located horizontally on either side of the fourth pair of nozzles 24. The flow of water through each pair of nozzles 21–25 is controlled by a separate valve so that its flow may be regulated independently of the other pairs of nozzles.

A soft cushion 30 is attached to the rim of the tub at the one end 20. The cushion 30 is formed of an outer covering of a vinyl material with a soft filler inside. The cushion 30 has a central cut out section in which a separate removable pillow 32 is located. The pillow 32 has a U-shaped inner pad of resilient material that conforms to the bather's neck. The pad is covered by a porous fabric membrane to form a rectangular shaped pillow that permits streams of water to pass there through from jets located beneath the pillow. Additional valves independently control the flow of water through the pillow in a pulsating or continuous manner to massage the bather's neck.

Figure 2:
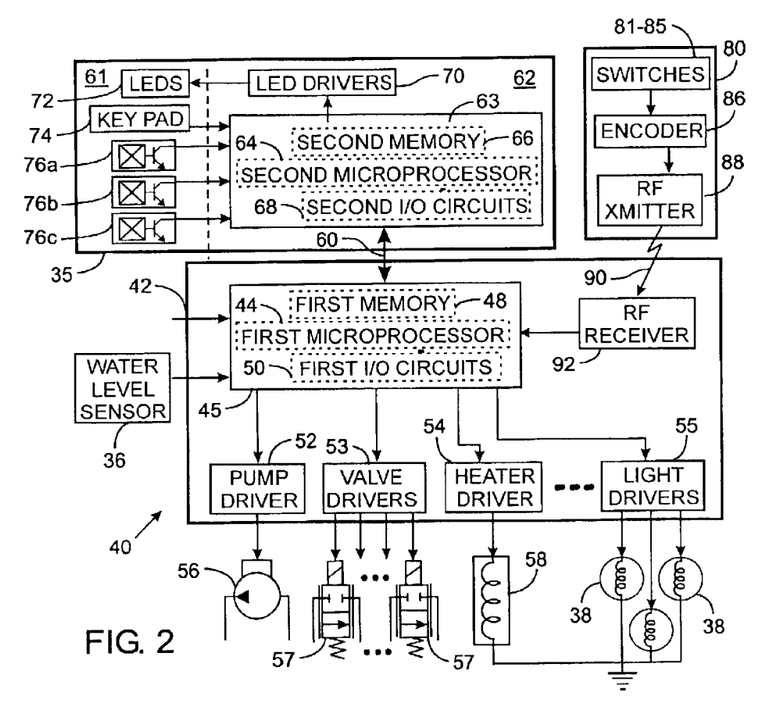
FIG. 2 is a schematic diagram of the control circuit for the whirlpool.

A user interface 35 is mounted on the side wall 16 of tub 12 and is part of a control circuit 40 shown in FIG. 2. Alternatively for whirlpools that mount in an aperture in a bathing deck, the user interface can be located on that deck adjacent the whirlpool. The user interface 35 is electrically coupled to a main controller 42 located underneath the tub adjacent the valves, pump, and other electrically operated whirlpool components. The bather operates the user interface 35 the to select various functions and components of the whirlpool 10 to activate and that selection is communicated to the main controller 42 which controls operation of those components.

The main controller 42 contains a first microcomputer 45 that has a first microprocessor 44 which executes software programs stored within a non-volatile first memory 48. The first memory 48 also stores data used by those programs. First input/output (I/O) circuits 50 couple sensors, such as a water level sensor 36 mounted in the tub wall 16 in FIG. 1, and other input devices to first microprocessor 44. The execution of the software program by the first microprocessor 44 produces output signals which are processed by a set of device drivers 52–55 to operate components of the whirlpool 10. One of those output signals is fed to a pump driver 52 which controls a pump 56. A group of other output signals are used by a set of drivers 53 to operate the valves 57 that control the flow of water through different groups of the whirlpool jets. Another output signal from the first microprocessor 44 is applied to a heater driver 54, for the whirlpool heater 58. Other types of output circuits can be provided, such as light drivers 55, which responds to other output signals by operating the lights 38 within the whirlpool.

The main controller 42 receives control commands from the user interface 35 via a communication line 60. The user interface 35 comprises an I/O device section 61 by which the bather enters input commands to control whirlpool functions and receives feedback as to the status of those functions. Specifically, the I/O device section 61 includes a keypad 74 and three Hall effect sensors 76a, b, and c, the function of which will be described. A plurality of light emitting diodes (LED's) 72 indicate the status of the available whirlpool functions.

The I/O device section 61 provides input commands to an interface controller 62 that includes a second microcomputer 63 having a second microprocessor 64 and a non-volatile second memory 66. The second memory 66 stores a software program that the second microprocessor 64 executes to govern the operation of the user interface 35. The microcomputer 63 also has a set of second I/O circuits 68 which couples the second microprocessor 64 to the I/O device section 61 and the communication line 60. A set of drivers 70 illuminate the plurality of LED's 72 in response to control signals from the second microprocessor 64. The second microprocessor 64 responds to input commands from the I/O device section 61 by generating control commands which are sent via the communication line 60 to the main controller 42. Those control commands then are relayed to the first microprocessor 44. It should be understood that the present invention may be implemented in a whirlpool control circuit which has a single controller that performs the combined functions of the main controller 42 and the interface controller 62.

Figures 3, 4, 5:
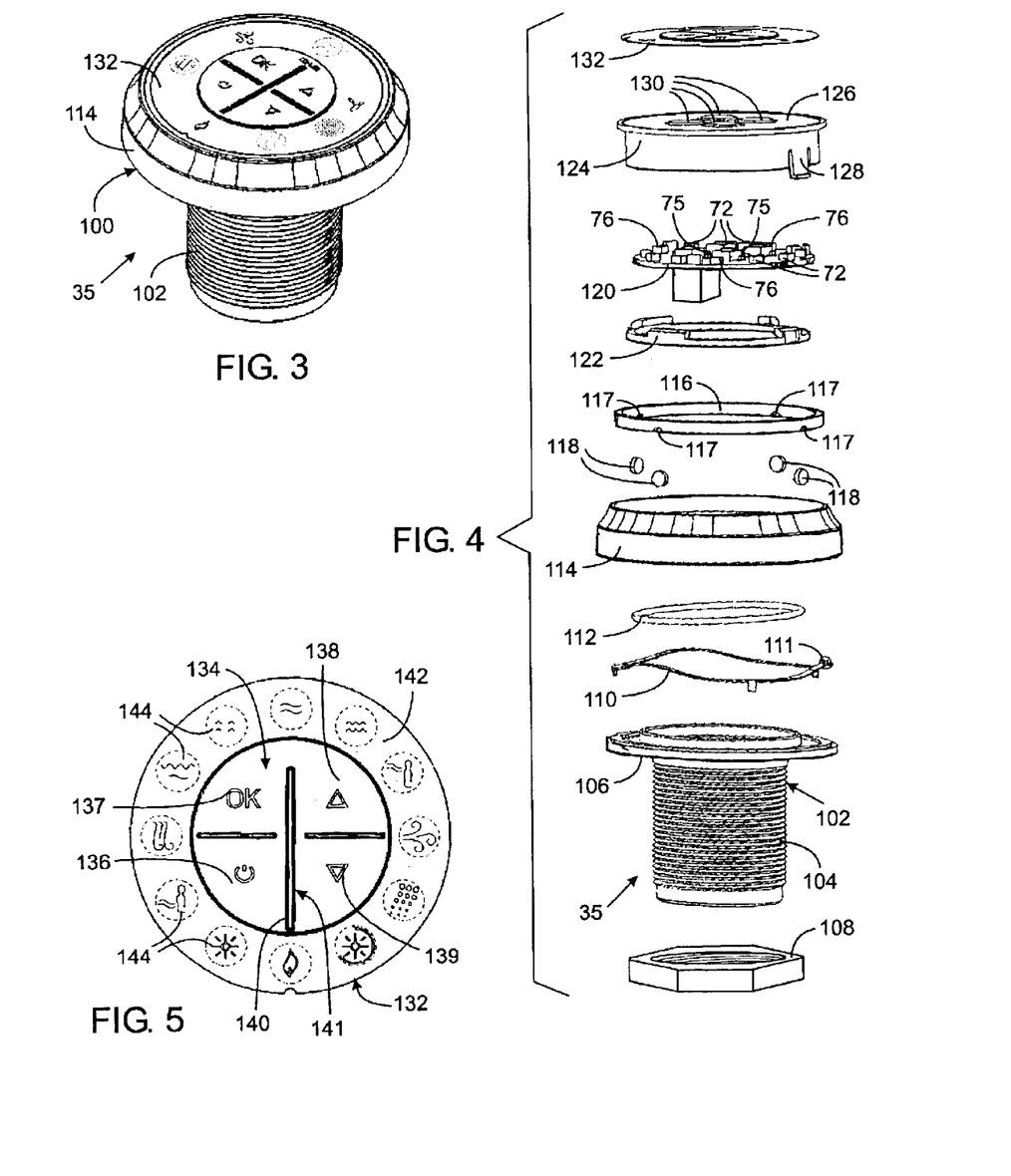
FIG. 3 is an isometric view of a user interface device according to the present invention for use with the whirlpool control circuit.
FIG. 4 is a plane view illustrating the keypad and display areas of the user interface device.
FIG. 5 is an exploded view of the user interface device.

With reference to FIGS. 3 and 4, the user interface 35 comprises a housing 100 that has a mounting base 102. The mounting base 102 comprises a tubular section 104 with external threads and an outwardly extending flange 106 at one end. When mounted on the whirlpool tub 12, the tubular section 104 extends through an aperture in the rim of the tub with the flange 106 abutting the surface of the rim. A fastening nut 108 is threaded onto the tubular section from beneath the tub to secure the user interface.

A detent spring 110 and a spacer ring 112 are stacked on the outer surface of the mounting base flange 106. An annular dial 114 extends around the flange 106 and is able to be rotated with respect to the mounting base 102. The detent spring 110 has a protrusion 111 which engages a rim within the dial 114. That rim has twelve notches which define twelve rotational positions of the dial 114 and those positions correspond to twelve whirlpool functions that are selectable by operation of the user interface 35, as will be described. As the dial 114 is rotated about the mounting base 102, the protrusion 111 rides into and out of each of these grooves, thereby providing a tactile feedback to the user when the dial 114 is in one of those twelve function positions.

Figure 6:
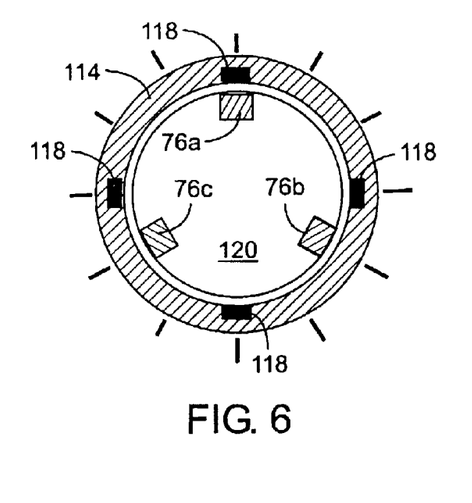
FIGS. 6–8 are schematic representations of the orientation of components of the user interface device in three operating positions.

A retaining ring 116 snaps into fixed engagement inside the dial 114 and has four notches 117 within which a separate permanent magnet disk 118 is received. The four permanent magnets 118 are spaced at 90° intervals around the dial 114, as seen in FIG. 6.

Returning to FIGS. 3 and 4, the user interface 35 further comprises a circular printed circuit board 120 on which the three Hall effect sensors 76a–c are mounted at 120° intervals around its circumference. Twelve of the light emitting diodes 72 also are equidistantly spaced around the outer circumferential region of the printed circuit board 120 and electrical switches 75 for the keypad 76 are mounted in a central region. The printed circuit board also contains the second microcomputer 63 and the LED drivers 70, described previously. A retaining ring 122 holds the printed circuit board 120 within a cup 124 that has a flat transverse wall 126 remote from the mounting base 102. A pair of latching tabs 128 project from the lip of the cup 124 through slots in the flange 106 and move into a locking position to secure the cup and the intermediate components of the user interface 35 to the mounting base 102. The cup 124 is fabricated of a transparent plastic, so as to transmit light emitted by the LED's 72 on the printed circuit board 120 housed therein. As will be described, a central portion of the cup wall 126 forms a part of the keypad 76 and has four flexible areas 130 which when depressed activate the switches 75 mounted on the printed circuit board 120.

A circular face plate 132 with printed indicia is adhered to the transverse surface 126 of the cup 124. As shown in FIG. 5, the face plate 132 has a central circular region 134 which is divided into quadrants forming input key areas 136, 137, 138 and 139 overlaying the flexible areas 130 of the cup. A first input key area 136 forms a master control key for activating and de-activating the entire whirlpool operation. The second input key area 137 defines a control key by which the user activates and de-activates a particular whirlpool function selected by another component of the user interface 35, as will be described. The remaining two input key areas 138 and 139 define control keys by which the user is able to increase or decrease the intensity of selected function, such as varying the rate of flow through a selected set of jets, for example.

The transparent region 140 at the center of the face plate 132 extends over a linear array of light emitting diodes on the printed circuit board 120, which forms a bar graph display 141. The number of those LED's that are illuminated by the second microcomputer 63 indicates the present intensity of the selected function.

An annular outer region 142 of the face plate 132 contains twelve indicia 144, each designating a different whirlpool function which the user is able to select. It should be understood that on a basic model of the whirlpool 10, some of the available twelve indicia will not be utilized because that model does not have all twelve functions which may be available only on the top of the line model whirlpool. Each face plate indicia 144 is partially transparent, either being translucent or having sections that are fully transparent so as to transmit light emitted by the light emitting diodes 72 located beneath indicia on the printed circuit board 120.

Figure 10:
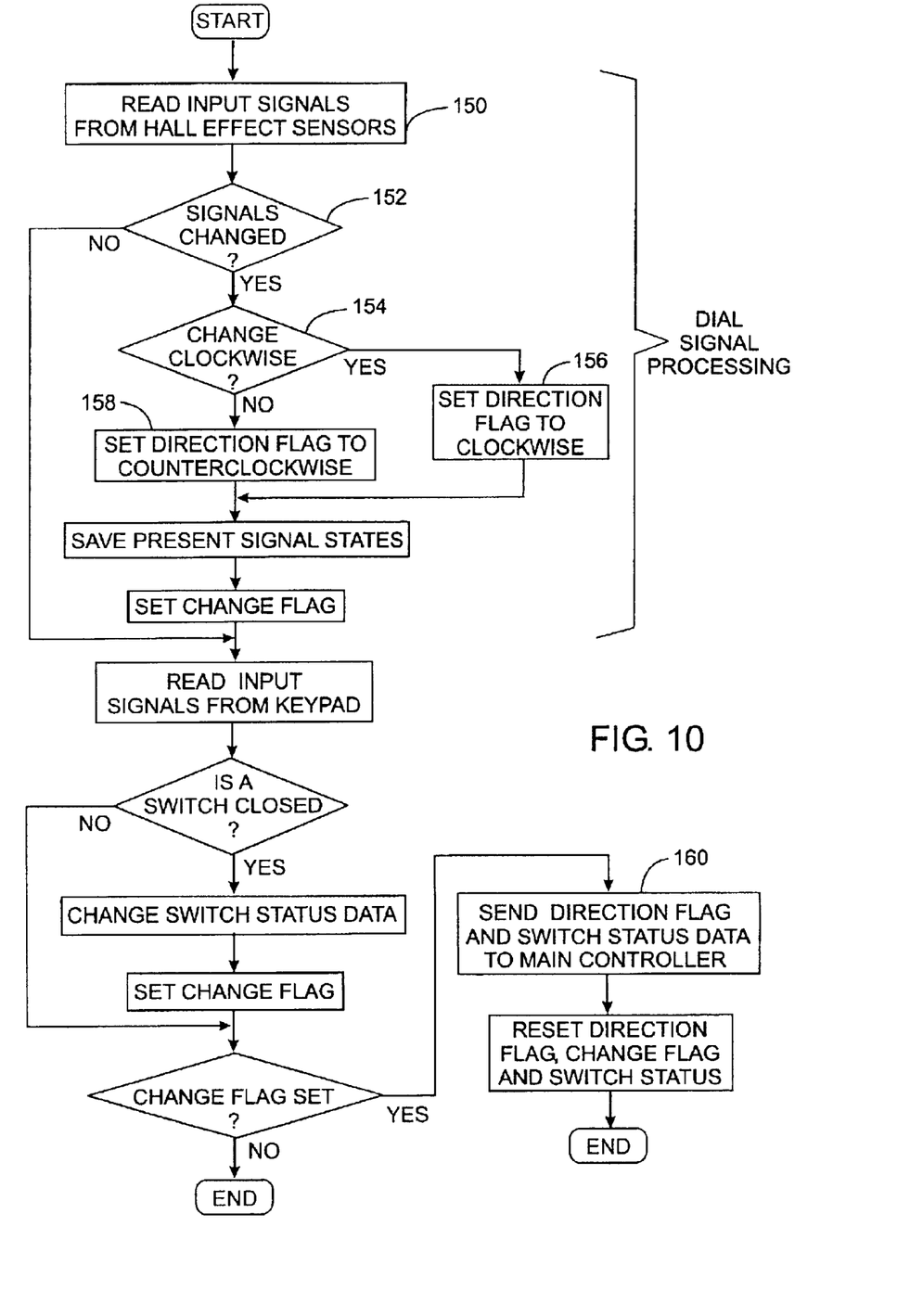
FIG. 10 is a flowchart of part of the operation of the user interface device.

The user selects one of the twelve whirlpool functions by rotating the annular dial 114 in a circular path in either direction about the mounting base 102 and printed circuit board 120. As will be described, rotation of the dial and the magnets attached thereto causes the Hall effect sensors 76a, b, and c to supply signals to the second microcomputer 63 within the user interface 35. The control circuit 40 responds to those signals by sequentially selecting different whirlpool functions and providing an indication of that selection back to the user by illuminating a corresponding indicia 144 on face plate 132. The process of interpreting the signals from the Hall effect sensors 76a–c depicted by the Dial Signal Processing section of the flowchart in FIG. 10 illustrating a routine that is executed periodically by the second microcomputer. At step 150, that routine reads the set of output signals produced by the three Hall effect sensors 76a–c and compares those signal states to their previous states stored in the second memory 66 to detect a change in those signals at step 152.

A given Hall effect sensor 76a, 76b, or 76c produces an active signal state is when one of the permanent magnets 118 is adjacent that sensor. In essence a Hall effect sensor is a switch which is operated by the magnetic field from a magnet in close proximity to the sensor and thereby controls the flow of current to an input of the second microcomputer 63. Thus the magnets are switch operators. With additional reference to FIG. 6, four permanent magnets 118 are secured at equal 90° increments to the dial 114. As the dial 114 is rotated, the four magnets 118 move around the printed circuit board 120, which remains stationary within the user interface 35. Thus, the three Hall effect sensors 76a–c spaced at equal 120° increments around the printed circuit board 12 also remain stationary relative to the rotation of the dial 114. Alternatively, magnetically operable reed switches can be used in place of the Hall effect sensors. The number of magnets multiplied by the number of sensors equals the maximum number of function positions to be sensed. The twelve function positions of the user interface 35 are indicated by the radial lines located outside the dial 114 in FIG. 6.

Figure 7:
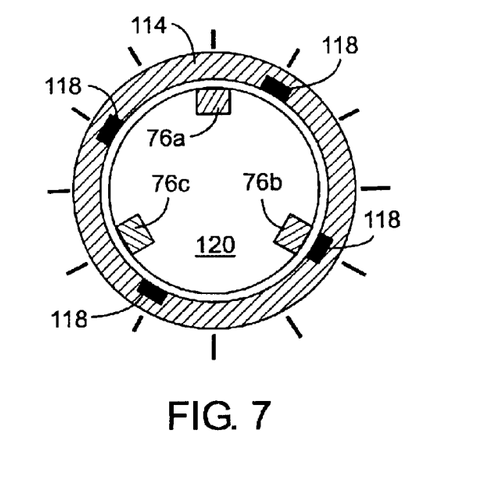

Assume that the initial position of the dial 114 is illustrated in FIG. 6 where a permanent magnet 118 is immediately adjacent only the first Hall effect sensor 76a. Thus, only that sensor 76a produces an active electrical signal which is applied to an input of the second microcomputer 63 within the user interface. If the user now rotates the dial 114 clockwise 30° into the next detent position for another whirlpool function, the four permanent magnets 118 are located with respect to the Hall effect sensors 76a, 76b, and 76c as shown in FIG. 7. In this position, a permanent magnet 118 is adjacent only the second Hall effect sensor 76b and thus only that sensor applies an active signal to the second microcomputer 63. The second microcomputer 63 is able to determine that the ring has been rotated clockwise one function position by observing the sensor signals and specifically observing the active signal transitioning from the first Hall effect sensor 76a to the second Hall effect sensor 76b.

Figure 8:
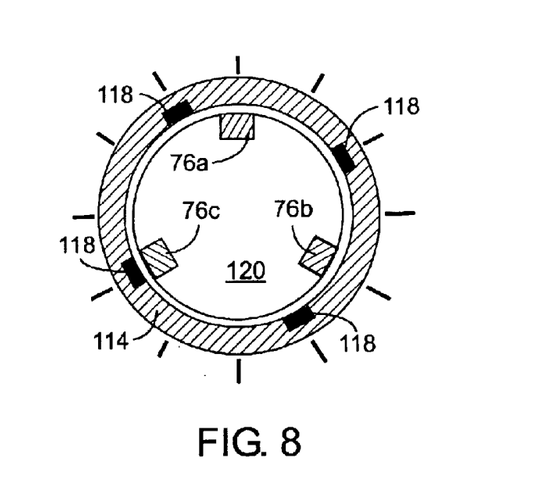

Further clockwise motion of the dial 114 another 30° places the components into the position depicted in FIG. 8. In this orientation, a permanent magnet 118 is immediately adjacent only the third Hall effect sensor 76c, which thus is the only sensor producing an active output signal sent to the second microcomputer 63. The second microcomputer 63 recognizes that the dial has moved another 30° clockwise by observing a transition of the active sensor output signal going from the second Hall effect sensor 76b to the third Hall effect sensor 76c.

Continued clockwise rotation of the dial 114 into the next function position places the components into an orientation which is depicted in FIG. 6 in which a different one of the permanent magnets 118 is now immediately adjacent the first Hall effect sensor 76a. This component orientation produces an corresponding transition of the active sensor signal from the third Hall effect sensor 76c to the first Hall effect sensor 76a which the second microcomputer 63 recognizes as corresponding to the addition dial movement.

As the dial continues moving clockwise around the printed circuit board 120 in a complete revolution, this transition pattern repeats four times. Because the set of output signals from the three Hall effect sensors 76a–c is the same at four different rotational positions of the annular dial 114, those output signals do not indicate a unique dial position. Instead a transition of the sensor output signals indicates movement of the dial by 30° and the direction of that movement. Determination of that amount and direction of movement causes the control circuit 40 to select another whirlpool function to be controlled. The selection of a function also indicates the position of the dial 114 as being in a position corresponding to the selected function.

If the user rotates the dial 114 in a counterclockwise direction around the printed circuit board 120 from an initial position depicted in FIG. 6, the permanent magnets 118 move sequentially into the positions indicated by FIG. 8 and then FIG. 7 before another magnet is adjacent the first Hall effect sensor 76a as shown in FIG. 6. This motion produces transitions of the active output signal going from the first Hall effect sensor 76a to the third Hall effect sensor 76c and then to the second Hall effect sensor 76b before returning to first Hall effect sensor 76a. By observing the pattern of the active output signal transitions the second microcomputer 63 is able to determine when the dial 114 moves between function positions and that the motion is occurring in the counterclockwise direction.

It should be understood that the present technique for determining movement of the dial to select a function can be applied to other types of dials. For example, this technique could be used with a dial in the form of a slider that moves in two directions along a linear path.

Referring again to the flowchart of FIG. 10, upon the detecting a change in the signals from the Hall effect sensor 76a, b, and c at step 152, second microprocessor 64 determines the direction of dial rotation by analyzing the signal transition at step 154. Then a direction flag is set at step 156 or 158 to indicate clockwise or counterclockwise rotation of the dial 114. Each time the direction flag is processed, its value is transmitted in a control command to the main controller 42 via the communication line 60 at step 160.

The first microcomputer 45 in the main controller 42 responds to the receipt of a control command with a direction flag by incrementing or decrementing a pointer to entries in a table of whirlpool functions stored in the first memory 48. Whether the function pointer is incremented or decremented is determined by the detected direction of dial rotation. That function pointer identifies the function of the whirlpool which is presently being controlled by the user interface 35. The first microcomputer 45 then sends a display command to user interface 35 instructing the second microcomputer 63 to illuminate the light emitting diode 72 beneath the indicium 144 that corresponds to the selected function as identified by the function pointer. This provides feedback to the user as to which function is currently selected by the second microcomputer 63. The first microcomputer 45 also sends a display command to the second microcomputer 63 indicating the number of the LED's to activate in the bar graph display 141 to provide the user with an indication of the intensity of the selected function.

The user interface 35 can be built into any one of several different whirlpool models. Although the present user interface provides twelve indicia positions 144, a particular whirlpool model may have less than twelve functions available. In which case, the function table contains less than twelve functions and not all the face plate indicia will be illuminated. In either situation, when the function pointer is incremented beyond the bottom of the table, it automatically raps around to the first item in the table. Correspondingly, if the function pointer is decremented beyond the first item of the table, it wraps around to the last item.

When the user has manipulated the annular dial 114 so that the indicia 144 corresponding to the desired function is illuminated, the keypad in the center of the face plate 132 can be used to control the operation of that function. Pressing the first key area 136 activates one of the switches 75 on the printed circuit board 120 producing an electrical signal which indicates that the entire whirlpool operation is to be commenced of terminated. By depressing the second key area 137 the user operates a different switch 75 to produce an indication that the selected function is to be activated or de-activated. These indications are transmitted at step 160 in FIG. 10 in control commands from the user interface 35 to the main controller 42 where the first microcomputer 45 toggles the entire system or the respective function on and off as designated by the transmitted indication.

Alternatively, the user may activate one of the keypad areas 138 or 139 to operated other ones of switches 75 to provide an indication that the intensity of the function is to be increased or decreased, respectively. Each activation of one of these keypad areas is processed as depicted by the lower section of the flowchart in FIG. 10. Then at step 160 the second microcomputer 63 sends a control command to the main controller 42 indicating which area was activated thereby causing the first microcomputer 45 to change the intensity of the selected function accordingly. The first microcomputer 45 then sends a display command back to the user interface 35 instructing the second microcomputer 63 to change the illumination of the LED's in the bar graph display 141 to indicate the new function intensity. For example, when a flow rate function is selected, the first microprocessor 44 looks up the value of a variable stored in memory 48 which designates the flow rate which defined the degree to open the valve for that function. That variable value is incremented or decremented depending on which key area 138 or 139 was pressed. The new variable value is used by the first microprocessor 44 to operate the driver 53 associated with the valve to this function. The new variable value also is used to determine the number of LED's in the bar graph display 141 to illuminate and that number is communicated in a display command sent from the main controller 42 to the second microcomputer 63 in the user interface 35.

Figure 9:
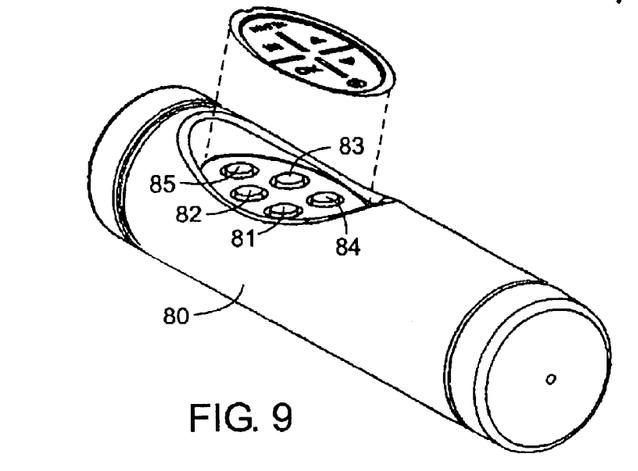
FIG. 9 is an isometric view of a handheld remote control for the whirlpool.

With reference to FIGS. 2 and 9, the main controller 42 also receives operator provided input signals from a wireless remote control 80 of a type similar to wireless remote controls commonly provided for consumer electronic equipment. The wireless remote control 80 has four switches 81, 82, 83, and 84 which correspond to the switch areas 136, 137, 138, and 139 of the keypad 134 on the user interface 35. A fifth switch 85 is provided on the wireless remote control 80 to step through the available functions. Operating the fifth switch 85 sends a signal to the first microcomputer 45 which responds by incrementing the function pointer as through the user rotated the dial ring of the user interface 35. The first microcomputer 45 also responds by sending a signal to the user interface that instructs the second microcomputer 63 to illuminate the LED 72 that corresponds to the selected function.

The switches 81–85 are connected to an encoder 86 that produces a control command indicating which switch has been operated by the user. That control command is modulated onto a radio frequency (RF) carrier by an RF transmitter 88 which produces a remote control signal 90. The remote control signal 90 is detected by a RF receiver 92 in the main controller 42 which recovers and applies the control command to an input of the first microprocessor 44. Alternatively, infrared light and of the forms of electromagnetic radiation may be employed in place of the radio frequency signal to carry the control commands to the main controller 42.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. A user interface which produces electrical signals for controlling plumbing equipment, said user interface comprising:
  a dial moveable into a plurality of positions along a path in response to manipulation by a user of the plumbing equipment, wherein X designates the number of those positions;
  a plurality of switch operators attached to the dial, wherein Y designates the number of switch operators;
  a plurality of first switches positioned along the path wherein each first switch produces an output signal when operated by one of the plurality of switch operators, wherein Z designates the number of first switches, and wherein Z is less than X; and
  a controller is connected to the plurality of first switches and determines motion of the dial in response to the output signals from the plurality of first switches.

2. The user interface as recited in claim 1 wherein the plurality of switch operators comprises a plurality of magnets; and the plurality of first switches responds to magnetic fields produced by the plurality of magnets.

3. The user interface as recited in claim 1 wherein the plurality of first switches comprises a plurality of Hall effect sensors.

4. The user interface as recited in claim 1 wherein the dial is ring shaped and rotates with respect to the plurality of first switches.

5. The user interface as recited in claim 1 wherein controller determines a magnitude and direction of motion of the dial in response to the output signals.

6. The user interface as recited in claim 1 wherein each of the plurality of positions corresponds to a different function of the plumbing equipment, and controller produces an indication of the position of the dial from the output signals produced by the plurality of first switches.

7. The user interface as recited in claim 6 wherein the controller operates components of the plumbing equipment in response to the position of the dial.

8. The user interface as recited in claim 1 wherein each of the plurality of positions corresponds to a different one of a plurality of functions of the plumbing equipment, and controller responds to the output signals produced by the plurality of first switches by selecting a given function from among the plurality of functions.

9. The user interface as recited in claim 8 further comprising a plurality of second switches operable by the user to produce electrical signals.

10. The user interface as recited in claim 9 wherein an electrical signal produced by the plurality of second switches indicates a desired change of a characteristic of the given function.

11. The user interface as recited in claim 10 further comprising an indicator of a magnitude of the characteristic of the given function.

12. The user interface as recited in claim 11 wherein an electrical signal produced by the plurality of second switches controls activation and deactivation of the given function.

13. The user interface as recited in claim 1 wherein the plurality of positions corresponds to a plurality of functions of the plumbing equipment; and further comprising indicia for the plurality of functions.

14. The user interface as recited in claim 1 further comprising a plurality of light emitters connected to the controller wherein each light emitter corresponds to a different one of a plurality of functions of the plumbing equipment.

15. The user interface as recited in claim 1 further comprising:
a handheld remote control including a plurality of third switches operable by the user to produce an input command for controlling the plumbing equipment, a transmitter connected to the plurality of third switches for producing a wireless signal indicating the input command; and
a receiver connected to the controller to receive the wireless signal and apply the input command to the controller.

16. The user interface as recited in claim 15 wherein the wireless signal is a radio frequency signal.

17. A user interface which produces electrical signals for controlling plumbing equipment, said user interface comprising:
a plurality of switches which are operable by a user of the plumbing equipment to produce a first set of electrical signals;
an annular dial rotatable in two directions into a plurality of positions in a path around the plurality of switches, wherein X designates the number of positions;
a sensor arrangement positioned adjacent the annular dial and producing a second set of electrical signals which indicate movement of the annular dial and a direction of that movement; and
a controller connected to the plurality of switches and the sensor arrangement, and being response to the direction of movement by selecting a given function of the whirlpool to control and responsive to the first set of electrical signals by producing control signals for operating the plumbing equipment.

18. The user interface as recited in claim 17 wherein the sensor arrangement comprises a plurality of magnets attached to the dial, wherein Y designates the number of magnets; and a plurality of magnetic sensors positioned along the path, wherein Z designates the number of magnetic sensors, and wherein each sensor produces an output signal when one of the plurality of magnets is adjacent thereto, thereby producing the second set of electrical signals, and wherein Z is less than the X.

19. The user interface as recited in claim 18 wherein Y multiplied by Z equals X.

20. The user interface as recited in claim 18 wherein Y equals four and the Z equals three.

21. The user interface as recited in claim 17 wherein each of the plurality of positions corresponds to a different function of the plumbing equipment, and the controller produces an indication of a present position of the dial from the second set of electrical signals.

22. The user interface as recited in claim 17 wherein the first set of electrical signals produced by the plurality of switches indicates that the given function is to be changed in intensity.

23. The user interface as recited in claim 22 further comprising an indicator of an intensity of the given function.

24. The user interface as recited in claim 17 wherein the first set of electrical signals indicates activation and deactivation of the given function.

25. The user interface as recited in claim 17 wherein each of the plurality of positions corresponds to a different function of the plumbing equipment; and further comprising a plurality of light emitters connected to the controller wherein each light emitter corresponds to a different one of the plurality of functions.

26. The user interface as recited in claim 17 further comprising:
a handheld remote control including a plurality of switches operable by the user to produce an input command for controlling the plumbing equipment, a transmitter connected to the plurality of switches for producing a wireless signal indicating the input command; and
a receiver connected to the controller to receive the wireless signal and apply the input command to the controller.

27. The user interface as recited in claim 26 wherein the wireless signal is a radio frequency signal.

28. A method for controlling plumbing equipment, said method comprising:
moving a dial with a plurality of magnets among a plurality of positions along a path, where X designates the number of positions and Y designates the number of magnets;
receiving output signals produced by a plurality of sensors positioned along the path where Z designates the number of sensors, and wherein each sensor produces an output signal when one of the plurality of magnets is adjacent thereto, and where Z is less than the X;
responding to the output signals by determining occurrence of motion of the dial and a direction of that motion; and
controlling the plumbing equipment in response to the occurrence and direction of the motion of the dial.

29. The method as recited in claim 28 further comprising determining a position of the dial from the output signals.

30. The method as recited in claim 28 wherein controlling the plumbing equipment comprises selecting a given function to be controlled.

31. The method as recited in claim 30 further comprising operating a light emitter to indicate the given function.

32. The method as recited in claim 30 further comprising operating an electrical switch to produce an indication that the given function is desired to be activated.

33. The method as recited in claim 30 further comprising operating an electrical switch to produce a signal indicating that intensity of the given function is desired to be changed.

34. The method as recited in claim 33 further comprising producing a visual indication of the intensity of the given function.

35. An apparatus, for controlling plumbing equipment, comprising:
- a plurality of switches which are operable by a user of the plumbing equipment to produce an input command;
- a dial moveable into a plurality of positions along a path in response to manipulation by a user of the plumbing equipment, where X designates the number of positions;
- a plurality of magnets attached to the dial where Y designates the number of magnets;
- a plurality of sensors positioned along the path where Z designates the number of sensors, and wherein each sensor produces a separate output signal when one of the plurality of magnets is adjacent thereto, and wherein Z is less than X; and
- an interface controller connected to the plurality of switches and the plurality of sensors and being responsive to the output signals from the plurality of sensors by determining when the dial moves and a direction of that movement, and producing a control command indicating at least one of the direction of dial movement and the input command;
- a main controller connected to the interface controller and to a plurality of electrically operated components of the plumbing equipment, the main controller responding to receipt of the control command by selecting a given function of the plumbing equipment to control based on the direction of dial movement, and responding to the an input command by altering operation of those of the plurality of electrically operated components associated with the given function.

36. The apparatus as recited in claim 35 wherein the dial is circular and rotates with respect to the plurality of sensors.

37. The apparatus as recited in claim 35 wherein an electrical signal produced by the plurality of switches indicates that the given function is to be changed in intensity.

38. The apparatus as recited in claim 37 further comprising an indicator of the intensity of the given function.

39. The user interface as recited in claim 35 further comprising a plurality of light emitters connected to the controller wherein each light emitter corresponds to a different one of a plurality of functions of the plumbing equipment and is independently operable to indicate the given function.

* * * * *